US008483006B1

(12) United States Patent
Chou et al.

(10) Patent No.: US 8,483,006 B1
(45) Date of Patent: Jul. 9, 2013

(54) PROGRAMMABLE ADDRESSING CIRCUITRY FOR INCREASING MEMORY YIELD

(75) Inventors: Hao-Yuan Howard Chou, San Jose, CA (US); Wei Zhang, San Jose, CA (US); Haiming Yu, Pleasanton, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/234,990

(22) Filed: Sep. 16, 2011

(51) Int. Cl.
*G11C 8/00* (2006.01)
*G11C 11/00* (2006.01)
*G11C 5/14* (2006.01)

(52) U.S. Cl.
USPC .......................... 365/242; 365/154; 365/227

(58) Field of Classification Search
USPC ................... 365/154, 155, 156, 227, 242
See application file for complete search history.

(56) References Cited

U.S. PATENT DOCUMENTS

| 5,835,429 | A * | 11/1998 | Schwarz .................. 365/201 |
| 6,212,116 | B1 * | 4/2001 | Kawaguchi ................ 365/203 |
| 6,333,895 | B1 * | 12/2001 | Hamamoto et al. ........ 365/233.1 |
| 7,277,351 | B2 | 10/2007 | Liu et al. |
| 7,644,385 | B1 | 1/2010 | Boyle et al. |
| 7,911,826 | B1 | 3/2011 | Liu et al. |
| 8,098,533 | B2 * | 1/2012 | Nii et al. ................. 365/189.11 |
| 2009/0303826 | A1 | 12/2009 | Perisetty |

* cited by examiner

*Primary Examiner* — Ly D Pham
(74) *Attorney, Agent, or Firm* — Treyz Law Group; Jason Tsai

(57) ABSTRACT

Integrated circuits with memory elements are provided. A memory element may include a storage circuit coupled to data lines through access transistors. The access transistors may have gates that are controlled by an address signal. The address signal may be asserted during read/write operations to turn on the access transistors so that read/write data can be passed through the access transistors. The voltage level to which the address signal is raised during read/write operations may be adjusted using programmable voltage biasing circuitry. A number of integrated circuits may be tested during device characterization procedures to determine the amount by which the address signal should be adjusted using the programmable voltage biasing circuit so that the memory elements in the integrated circuits satisfy design criteria.

16 Claims, 9 Drawing Sheets

PROGRAMMABLE ADDRESSING CIRCUITRY FOR INCREASING MEMORY YIELD

BACKGROUND

Integrated circuits such as programmable integrated circuits may contain volatile memory elements in the form of static random access memory (SRAM) cells. In programmable integrated circuits, SRAM cells may serve as configuration random access memory (CRAM) cells. Programmable integrated circuits are a type of integrated circuit that can be programmed by a user to implement a desired custom logic function. CRAM cells are used to store configuration data supplied by the user. Once loaded, CRAM cells supply control signals to transistors to configure the transistors to implement the desired logic function.

Volatile memory elements such as SRAM and CRAM cells are typically formed using a pair of cross-coupled inverters. In each memory cell, the pair of cross-coupled inverters may be connected to an address transistor that is turned on when data is being read from or written into the memory cell. When no data is being read from or written into the memory cell, the address transistor is turned off to isolate the memory cell.

There is a trend with each successive generation of integrated circuit technology to scale transistors towards smaller sizes, lower threshold voltages, and lower power supply voltages. Lower power supply voltages and smaller devices may lead to decreased read/write margins for volatile memory elements. This can pose challenges for reliable device operation.

Moreover, smaller devices tend to suffer more from process, voltage, and temperature variations (PVT variations). Operating the memory elements at lower power supply voltages can further exacerbate the amount of variation experienced by the memory elements, resulting in reduced memory yield.

SUMMARY

Integrated circuits may include memory elements. A memory element may include a latching circuit (e.g., a storage circuit based on cross-coupled inverters). The latching circuit may be coupled to data lines through at least one access transistor. The at least one access transistor may be used to read data from and write data into the memory element.

The at least one access transistor may have a gate that is coupled to a word line (e.g., an address line on which a word line signal is provided). The word line signal may be asserted during read/write operations and may be deasserted during normal operation. The level to which the word line signal is raised during read/write operations may be set using programmable voltage biasing circuitry. The programmable voltage biasing circuitry may include a resistive chain and may be configured to provide adjustable word line voltage levels.

During silicon characterization operations, a sample group of integrated circuit dies that include memory elements may be tested. For example, each die may be tested to determine whether all of its memory elements are capable of performing read/write operations at different power supply levels. If at least one memory element on a given die fails to perform a read operation at a selected power supply level, the given die may be marked as a faulty die at the selected read power supply level. If at least one memory element on the given die fails to perform a write operation at a selected power supply level, the given die may be marked as a faulty die at the selected write power supply level. Memory yield may be computed by dividing the number of non-defective dies by the total number of tested dies for read and write operations.

Memory yield values may be computed at different power supply levels. The memory yield at a predetermined power supply level may or may not be greater than a user-specified memory yield. The memory yield corresponding to the predetermined power supply level may be increased by reconfiguring the programmable voltage biasing circuitry to adjust the word line voltage accordingly.

For example, if the minimum power supply voltage for the memory elements is limited by read performance (e.g., if the memory elements exhibit read margins that are less than write margins), the programmable voltage biasing circuitry may be configured to provide reduced word line voltage levels. If the minimum power supply voltage for the memory elements is limited by write performance (e.g., if the memory cells have read margins that are greater than write margins), the programmable voltage biasing circuitry may be configured to provide elevated word line voltage levels.

Further features of the present invention, its nature and various advantages will be more apparent from the accompanying drawings and the following detailed description.

DETAILED DESCRIPTION

Embodiments of the present invention relate to integrated circuits that include arrays of volatile memory elements. Memory element arrays can be used to store data during data processing operations. In programmable integrated circuits such as programmable logic devices, arrays of memory elements may be loaded with configuration data that is used in configuring programmable logic circuitry. Memory elements that are used in storing configuration data for programmable integrated circuits are sometimes referred to as configuration random-access memory (CRAM) cells. Memory cells used in other types of random-access memory (RAM) arrays are sometimes referred to as RAM cells.

Memory cells can be used in any suitable integrated circuit that uses memory. Such types of integrated circuits may include memory chips, digital signal processing circuits with memory arrays, microprocessors, application specific integrated circuits with memory arrays, programmable integrated circuits such as programmable logic device integrated circuits in which memory cells are used for configuration memory, or any other suitable integrated circuit.

For clarity, the embodiments of the present invention may sometimes be described in the context of programmable logic device integrated circuits. This is, however, merely illustrative and not intended to limit the scope of the present invention. Memory cells in accordance with embodiments of the present invention may be used in any suitable circuits. On integrated circuits such as memory chips or other circuits in which memory is needed to store processing data, the memory cells may perform the functions of static random-access memory (RAM) cells and are sometimes referred to as SRAM cells. In the context of programmable logic device integrated circuits, the memory cells can be used to store configuration data and are therefore sometimes referred to in this context as configuration random-access memory (CRAM) cells.

Figure 1A:
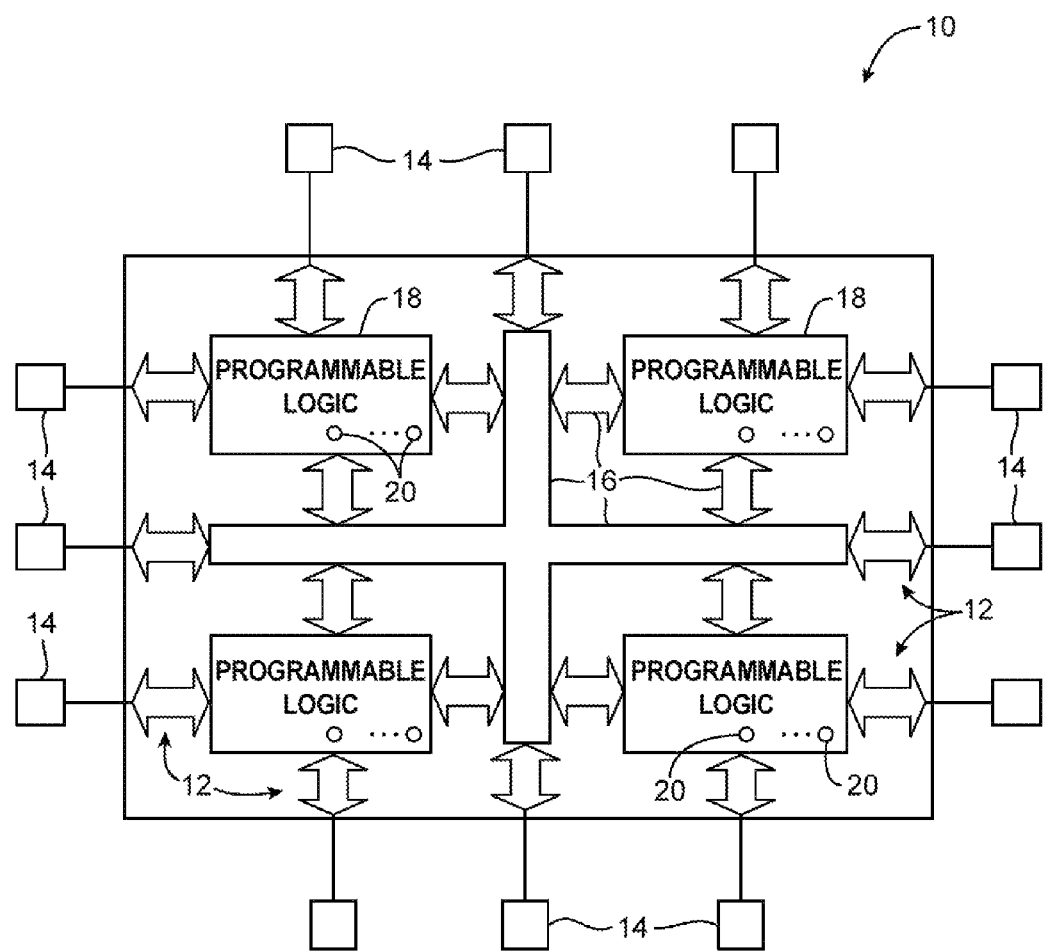
FIG. 1A is a diagram of an illustrative programmable integrated circuit in accordance with an embodiment of the present invention.

An illustrative integrated circuit 10 comprising memory is shown in FIG. 1A. Device 10 may have input/output (I/O) circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Device 10 contains volatile memory cells 20 that can be loaded with configuration data (also called programming data) using pins 14 and input/output circuitry 12. Once loaded, the memory cells can provide corresponding static control output signals that control the state of an associated logic component in programmable logic 18. If desired, memory cells 20 may be used in SRAM-type memory arrays (e.g., to store data for processing circuitry during operation of device 10).

Memory cell 20 may be formed from a number of transistors configured to form a bistable circuit. With one suitable approach, complementary metal-oxide-semiconductor (CMOS) integrated circuit technology is used to form memory cell 20, so CMOS-based memory cell implementations are described herein as an example. If desired, other integrated circuit technologies may be used to form the memory cells and the integrated circuit in which the memory cells are used to form memory arrays.

The memory cells may be loaded from an external erasable-programmable read-only memory and control chip or other suitable data source via pins 14 and input/output circuitry 12. Loaded CRAM memory cells 20 may provide static control signals that are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors, parts of multiplexers, look-up tables, logic arrays, AND, OR, NAND, and NOR logic gates, etc.

The memory cells 20 may be arranged in an array pattern. In a typical modern programmable logic device, there may be millions of memory cells 20 on chip 10. During programming operations, the array of memory cells is provided with configuration data by a user (e.g., a logic designer). Once loaded with configuration data, the memory cells 20 selectively control portions of the circuitry in the programmable logic 18 and thereby customize its functions so that it will operate as desired.

The circuitry of device 10 may be organized using any suitable architecture. As an example, the logic of device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

When memory cells 20 are arranged in an array, horizontal and vertical conductors and associated control circuitry may be used to access the memory cells. The control circuitry may, for example, be used to clear all or some of the memory cells. The control circuitry may also write data into the memory cells and may read data from the memory cells. For example, in CRAM arrays, the memory cells may be loaded with configuration data. Loaded configuration data may then be read out from the array to confirm proper data loading operations before device 10 is used during normal operation in a system.

Figure 1B:
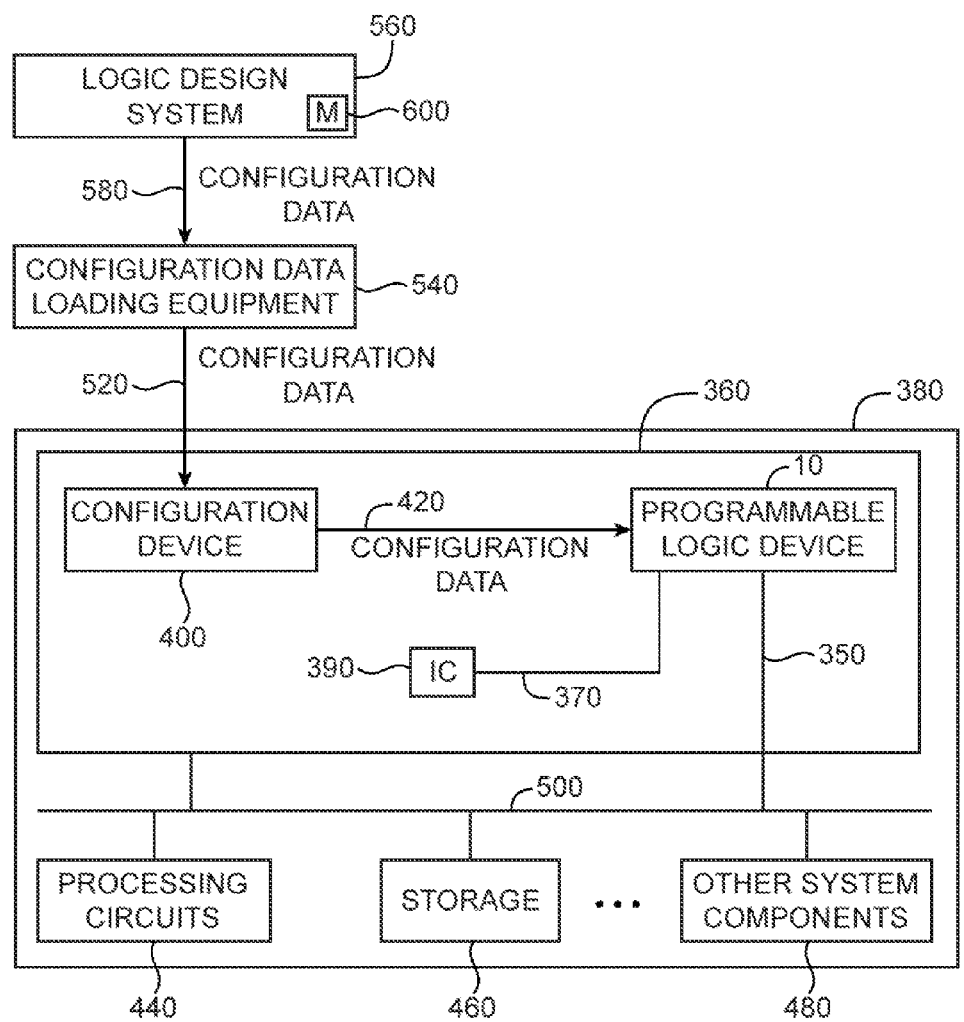
FIG. 1B is a diagram of an illustrative system environment in which a programmable integrated circuit may be used in accordance with an embodiment of the present invention.

An illustrative system environment for integrated circuits such as programmable integrated circuits is shown in FIG. 1B. Device 10 may be mounted on a board 360 in a system 380. Device 10 may receive configuration data from programming equipment or from any other suitable equipment or device.

In the example of FIG. 1B, device 10 is a type of programmable integrated circuit that receives configuration data from an associated integrated circuit 400. With this type of arrangement, circuit 400 may, if desired, be mounted on the same board 36 as device 10. Circuit 400 may be a programmable logic device configuration data loading chip that loads configuration data into programmable logic device memory from an external erasable-programmable read-only memory (EPROM) chip, a programmable logic device configuration data loading chip with built-in memory (sometimes referred to as a configuration device), or any other suitable device. When system 380 boots up (or at another suitable time), the configuration data may be supplied to device 10 from device 400, as shown schematically by path 420. The configuration data that is supplied to device 10 may be stored in its configuration random-access-memory elements 20.

System 380 may include processing circuits 440, storage 460, and other system components 480 that communicate with device 10. The components of system 380 may be located on one or more boards such as board 360 or other suitable mounting structures or housings.

Communication paths may be used to interconnect device 10 to other components. For example, communication path 370 may be used to convey data between an integrated circuit 390 that is mounted on board 360 and device 10. Communication paths 350 and 500 can be used to convey signals between device 10 and components 440, 460, and 480.

Configuration device 400 may be supplied with the configuration data for device 10 over a path such as path 520. Configuration device 400 may, for example, receive the configuration data from configuration data loading equipment 540 or other suitable equipment that stores this data in configuration device 400. Device 400 may be loaded with data before or after installation on board 360.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 1B, the configuration data produced by a logic design system 560 may be provided to equipment 540 over a path such as path 580. Equipment 540 provides the configuration data to device 400 so that device 400 can later provide this configuration data to device 10 over path 420. System 560 may be based on one or more computers and one or more software programs. In general, software and data may be stored on any computer-readable medium (storage) in system 560 and is shown schematically as storage 600.

In a typical scenario, logic design system 560 is used by a logic designer to create a custom circuit design. The system 560 produces corresponding configuration data which is provided to configuration device 400. Upon power-up, configuration device 40 and data loading circuitry on device 10 is used to load the configuration data into the programmable memory elements 20 of device 10. Device 10 may then be used in normal operation of system 38.

Figure 2:
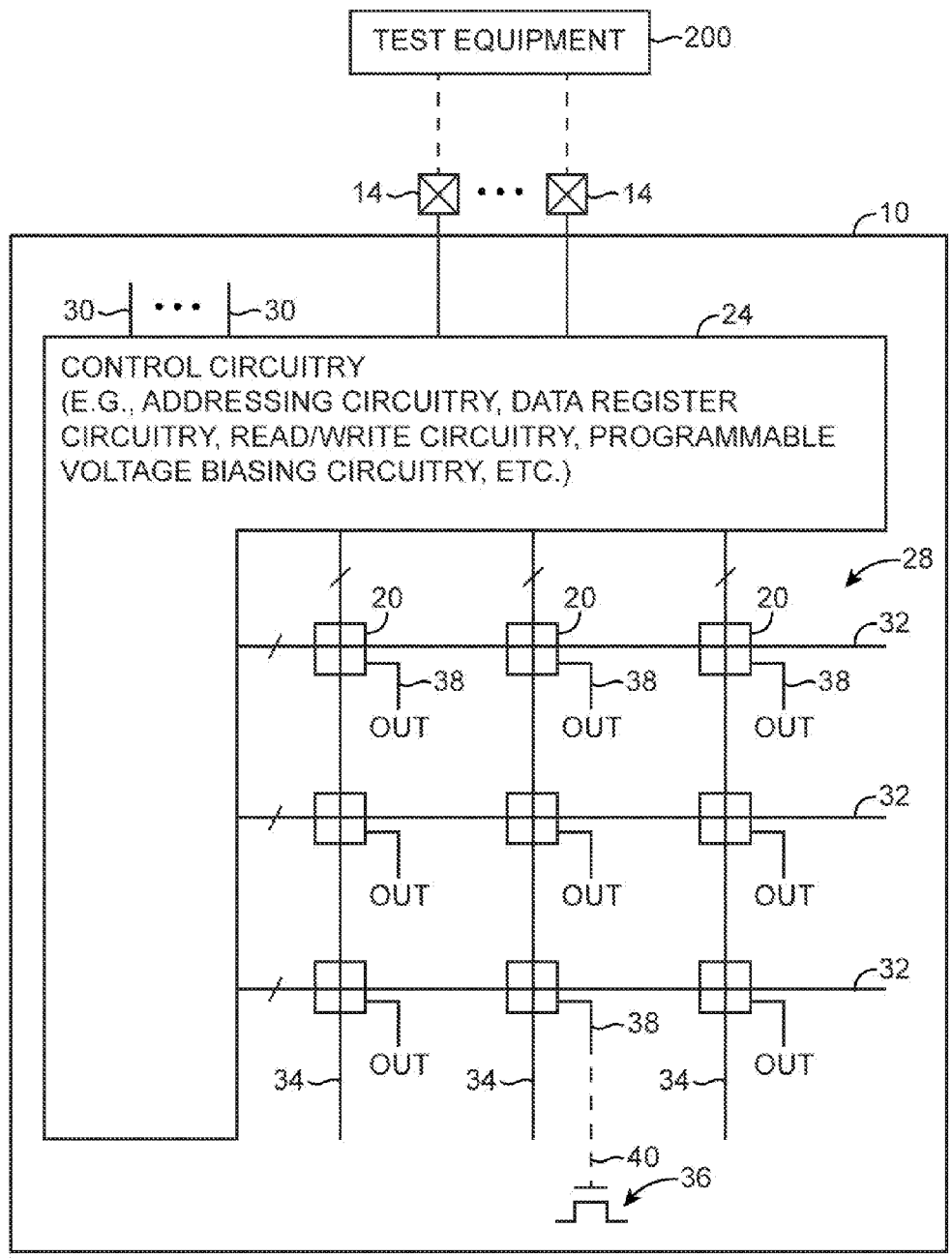
FIG. 2 is a diagram of an illustrative memory array in accordance with an embodiment of the present invention.

Any suitable memory array architecture may be used for arranging memory cells 20. One suitable arrangement is shown in FIG. 2. There are only three rows and columns of memory cells 20 in the illustrative array of FIG. 2, but in general there may be hundreds or thousands of rows and columns in memory array 28. Array 28 may be one of a number of arrays on device 10, may be a subarray that is part of a larger array, or may be any other suitable group of memory cells 20.

Each memory cell 20 may supply a corresponding output signal OUT at a corresponding output path 38. In CRAM arrays, each signal OUT is a static output control signal that may be conveyed over a corresponding path 40 and may be used in configuring an associated transistor such as transistor 36 (e.g., a pass transistor) or other suitable circuit elements in an associated programmable logic circuit.

Integrated circuit 10 may have control circuitry 24 for supplying signals to memory array 28. Control circuitry 24 may receive power supply voltages, data, and other signals from external sources using pins 14 and from internal sources using paths such as paths 30. Control circuitry 24 may include circuitry such as addressing circuitry, data register circuitry, read/write circuitry, etc. Control circuitry 24 may use the power supply voltages supplied through pins 14 to produce desired time-varying and fixed signals on paths 32 and 34.

There may, in general, be any suitable number of conductive lines associated with paths 32 and 34. For example, each row of array 28 may have a respective path 32 that includes associated address lines (e.g., a true address line and a complement address line) and/or associated read/write enable lines (as examples). Each column of array 28 may have a respective path 34 that includes data lines (e.g., a true data line and a complement data line). If desired, a clear signal may be routed to all of cells 20 in array 28 simultaneously over a common clear line. The clear line may be oriented vertically so that there is one branch of the clear line in each path 34 or may be oriented horizontally so that there is one branch of the clear line in each path 32. The clear line need not be necessary.

Power can also be distributed in this type of global fashion. For example, a positive power supply voltage Vcc may be supplied in parallel to each cell 20 using a pattern of shared horizontal or vertical conductors. A ground voltage Vss may likewise be supplied in parallel to cells 20 using a pattern of shared horizontal or vertical lines. Control lines such as address lines and data lines are typically orthogonal to each other (e.g., address lines are horizontal, whereas data lines are vertical or vice versa).

Positive power supply voltage Vcc may be provided over a positive power supply line, whereas ground voltage Vss may be provided over a ground power supply line. Any suitable value may be used for positive power supply voltage Vcc and ground voltage Vss. For example, positive power supply voltage Vcc may be 1.2 V, 1.1 V, 1.0 V, 0.9 V, less than 0.9 V, or any other suitable voltage. Ground voltage Vss may be zero volts or 0.1 V (as examples). In a typical arrangement, power supply voltage Vcc may be 0.85 V, Vss may be zero volts, and the signal levels for address, data, and clear signals may range from zero volts (when low) to 0.85 V (when high). Arrangements in which Vcc varies as a function of time, in which Vss is less than zero volts, and in which control signals are overdriven (i.e., in which control signals have signal strengths larger than Vcc-Vss) may also be used, if desired.

The terms "rows" and "columns" merely represent one way of referring to particular groups of cells 20 in memory array 28 and may sometimes be used interchangeably. If desired, other patterns of lines may be used in paths 32 and 34. For example, different numbers of power supply signals, data signals, and address signals may be used.

Device 10 may be coupled to test equipment 200 via pins 14 during test and device characterization operations. Test equipment 200 may include logic design and analysis tools, test signal generators, oscilloscopes, test cables, a personal computer, control circuitry, and other suitable computing equipment for testing device 10.

Figure 3:
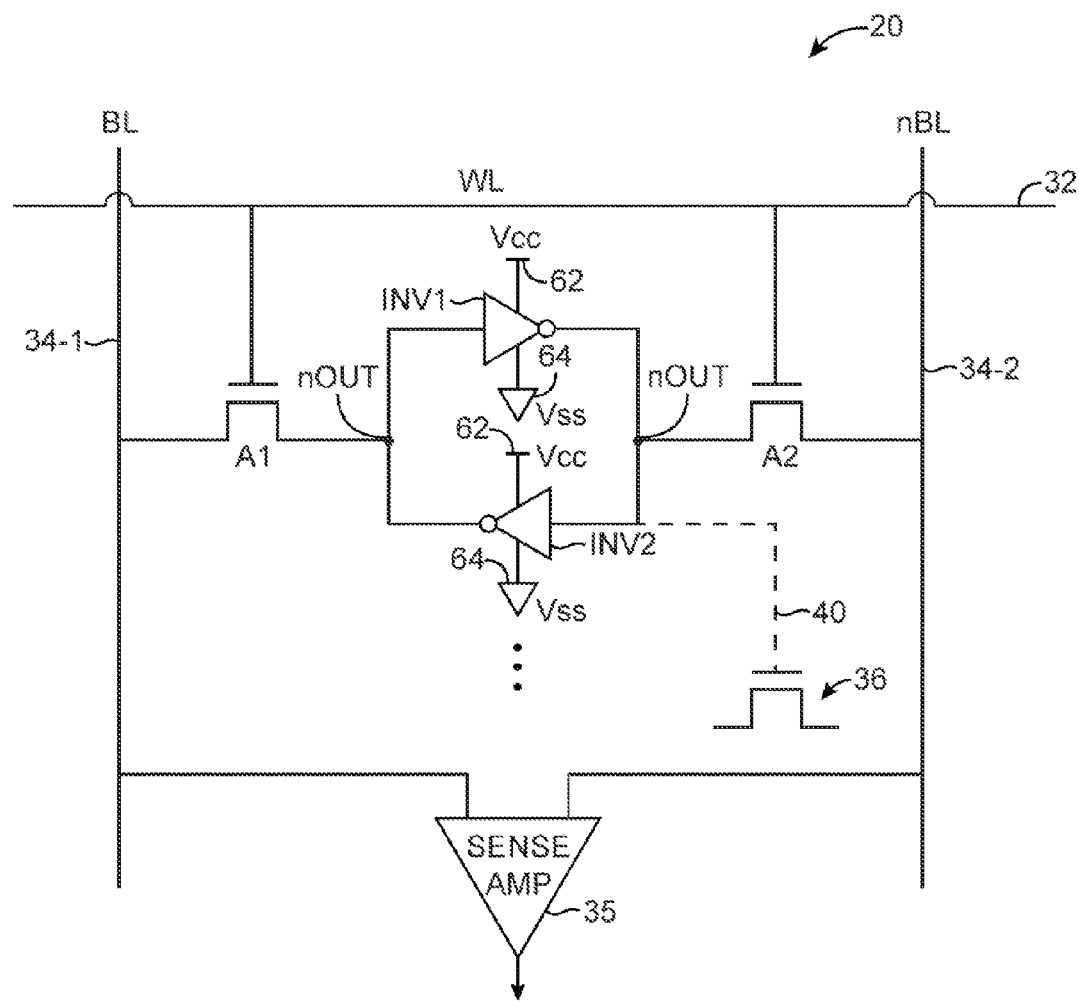
FIG. 3 is a diagram of an illustrative memory cell in accordance with an embodiment of the present invention.

FIG. 3 shows an exemplary memory cell 20. As shown in FIG. 3, memory cell 20 may include a storage circuit formed using a pair of cross-coupled inverters INV1 and INV2. Inverters INV1 and INV2 may each have an input and an output. The output of inverter INV1 may be coupled to the input of inverter INV2, whereas the output of inverter INV2 may be coupled to the input of inverter INV1. A storage circuit formed in this arrangement may be used to store a single bit of data and may sometimes be referred to as a bistable circuit or a latching circuit.

Inverters INV1 and INV2 may each have a first power supply terminal that is coupled to positive power supply line 62 (e.g., a positive power supply line on which memory cell power supply voltage Vcc is provided) and a second power supply terminal that is coupled to ground power supply line 64 (e.g., a ground power supply line on which ground voltage Vss is provided). Voltage Vcc may be 1 V, 0.85 V, less than 0.85 V, or other suitable voltage levels (as examples).

The output of inverter INV2 may serve as a first data storage node nOUT for memory cell 20, whereas the output of inverter INV1 may serve as a second data storage node OUT for memory cell 20. True and complement versions of a single data bit may be stored on data storage nodes OUT and nOUT, respectively. For example, memory cell 20 may be configured to store a "1" (e.g., storage nodes OUT and nOUT may be high and low, respectively) and may be configured to stored a "0" (e.g., storage nodes OUT and nOUT may be low and high, respectively).

Memory cell 20 may include a first access transistor A1 that is coupled between first data storage node nOUT and a first data line 34-1 (e.g., a first data line on which true data line signal BL is provided) and a second access transistor A2 that is coupled between second data storage node OUT and a second data line 34-2 (e.g., a second data line on which complement data line nBL is provided). Data lines 34-1 and 34-2 may sometimes be referred to as bit lines. Access transistors A1 and A2 may each have a gate that is coupled to an associated address line 32 (e.g., a control line on which word line signal WL is provided). Access transistors A1 and A2 may therefore sometimes be referred to as address transistors, and address line 32 may sometimes be referred to as a word line.

During normal operation (e.g., a normal operating mode in which cell 20 holds configuration data), signal WL is deasserted (e.g., word line signal WL is held low) to turn off access transistors A1 and A2 so that the storage portion of cell 20 holds stored data values at the first and second data storage nodes. For example, memory cell 20 holding a "0" may have first data storage node nOUT at logic "1" and second data storage node OUT at logic "0."

During read operations, data lines 34-1 and 34-2 may be precharged (e.g., data signals BL and nBL may be precharged to a high voltage). Word line signal WL may then be asserted (e.g., signal WL may be raised high) to enable access transistors A1 and A2 for reading data from memory cell 20. Sensing circuitry such as sense amplifier 35 may be coupled to data lines 34-1 and 34-2 to determine whether memory cell 20 is storing a "0" (e.g., whether storage node OUT is storing a "0") or a "1" (e.g., whether storage node OUT is storing a "1").

During write operations, desired data values may be presented on data lines 34-1 and 34-2 and word line signal WL may be asserted to enable access transistor A1 and A2 to pass the desired data values into memory cell 20. For example, signal BL on data line 34-1 may be driven high while signal nBL on data line 34-2 may be driven low to write in a "0" into memory cell 20.

As described in connection with FIG. 2, each memory cell 20 may supply an output signal on corresponding output path 40. Output path 40 may be coupled to data storage node OUT. Each output signal is a static output control signal that may be used in configuring corresponding transistor 36 (e.g., the output signal may be used to control the gate of corresponding transistor 36) or other circuit element in an associated programmable logic circuit. The state of transistor 36 (off or on) controls whether signals are allowed to pass between its source-drain terminals.

Memory cell 20 of FIG. 3 is merely illustrative and is not intended to limit the scope of the present invention. If desired, memory cell 20 may be formed using more than two cross-coupled inverter or inverter-like circuits, may include any number of access transistors, may include a clear transistor, may include read buffer transistors, may be formed using a multiport memory architecture, etc.

The read performance of cell 20 may be characterized by its read margin (sometimes referred to as "static noise margin"), whereas the write performance of cell 20 may be characterized by its write margin. Read margin can be enhanced at the expense of degrading write margin, whereas write margin can be enhanced at the expense of degrading read margin. For example, the read margin of cell 20 can be improved by reducing the size of transistors A1 and A2 and increasing the size of inverters INV1 and INV2, whereas the write margin of cell 20 can be improved by increasing the size of transistors A1 and A2 and decreasing the size of inverters INV1 and INV2. This tradeoff between read and write margins may pose challenges for a memory cell designer.

There is a trend with each successive generation of integrated circuit technology to scale transistors towards smaller sizes, lower threshold voltages, and lower power supply voltages. Lower power supply voltages and smaller devices may lead to decreased read/write margins for memory cell 20. Oftentimes, memory read/write margins limit the minimum power supply operating voltage (sometimes referred to as Vccmin) for device 10.

For example, the minimum power supply voltage (indicated herein as Vccmin_read) that is required to operate memory array 28 so that all memory cells 20 are able to properly perform read operations may be defined as the minimum power supply voltage level to which data lines 34-1 and 34-2 needs to be precharged, to which signal WL needs to be raised, and to which the cross-coupled inverters need to biased during read operations. The minimum power supply voltage (indicated herein as Vccmin_write) that is required to operate memory array 28 so that all memory cells 20 are able to properly perform write operations may be defined as the minimum power supply voltage to which at least one of data lines 34-1 and 34-2 needs to be driven, to which signal WL needs to be raised, and to which the cross-coupled inverters need to be biased during data loading operations.

It is generally desirable to minimize Vccmin (i.e., a group of memory cells 20 that are capable of operating at lower voltages are functionally more robust). Voltage Vccmin may be set by the greater of Vccmin_read and Vccmin_write. For example, Vccmin may be equal to Vccmin_read if Vccmin_read is greater than Vccmin_write, and vice versa. Typically, Vccmin_read and Vccmin_write are not equal, and Vccmin will be set by the greater of the two read/write metrics. It may therefore be desirable to equalize Vccmin_read and Vccmin_write to reduce Vccmin (e.g., by adjusting the operating voltages associated with memory cells 20 to selectively increase one of Vccmin_read/Vccmin_write while decreasing the other until the two metrics are approximately equal or until memory cells 20 satisfy design criteria).

Vccmin_read and Vccmin_write can be changed by adjusting the read and write margins of memory cell 20. One way of adjusting the read/write margins of memory cell 20 is to tune the word line voltage level. Tuning the level to which word line signal WL is raised may serve to control the strength of access transistors A1 and A2 and can directly impact the strength with which data is written into cell 20 during data loading operations and the amount of disturbance experienced by cell 20 during data read operations.

For example, consider a scenario in which a given memory cell 20 is operated using a 0.85 V power supply (i.e., Vcc is equal to 0.85 V and signals BL, nBL, and WL are raised to 0.85 V during read/write operations). The given memory cell 20 operating at 0.85 V may have a read margin of 0.3 V and a write margin of 0.2 V. In this example, Vccmin_write associated with device 10 containing given memory cell 20 may be greater than Vccmin_read because the write margin is less than the read margin.

In this scenario, word line signal WL may be increased to 1.0 V when asserted (as an example) while the other control voltages remain at 0.85 V. Selectively adjusting the asserted level of signal WL may result in a new read margin of 0.25 V and a new write margin of 0.24 V. Tuning read/write margin in this way may serve to reduce the difference between Vccmin_write and Vccmin_read and lower Vccmin. In general, the word line voltage level can be increased to reduce Vccmin_write and increase Vccmin_read, whereas the word line voltage level can be lowered to reduce Vccmin_read and increase Vccmin_write.

Figure 4:
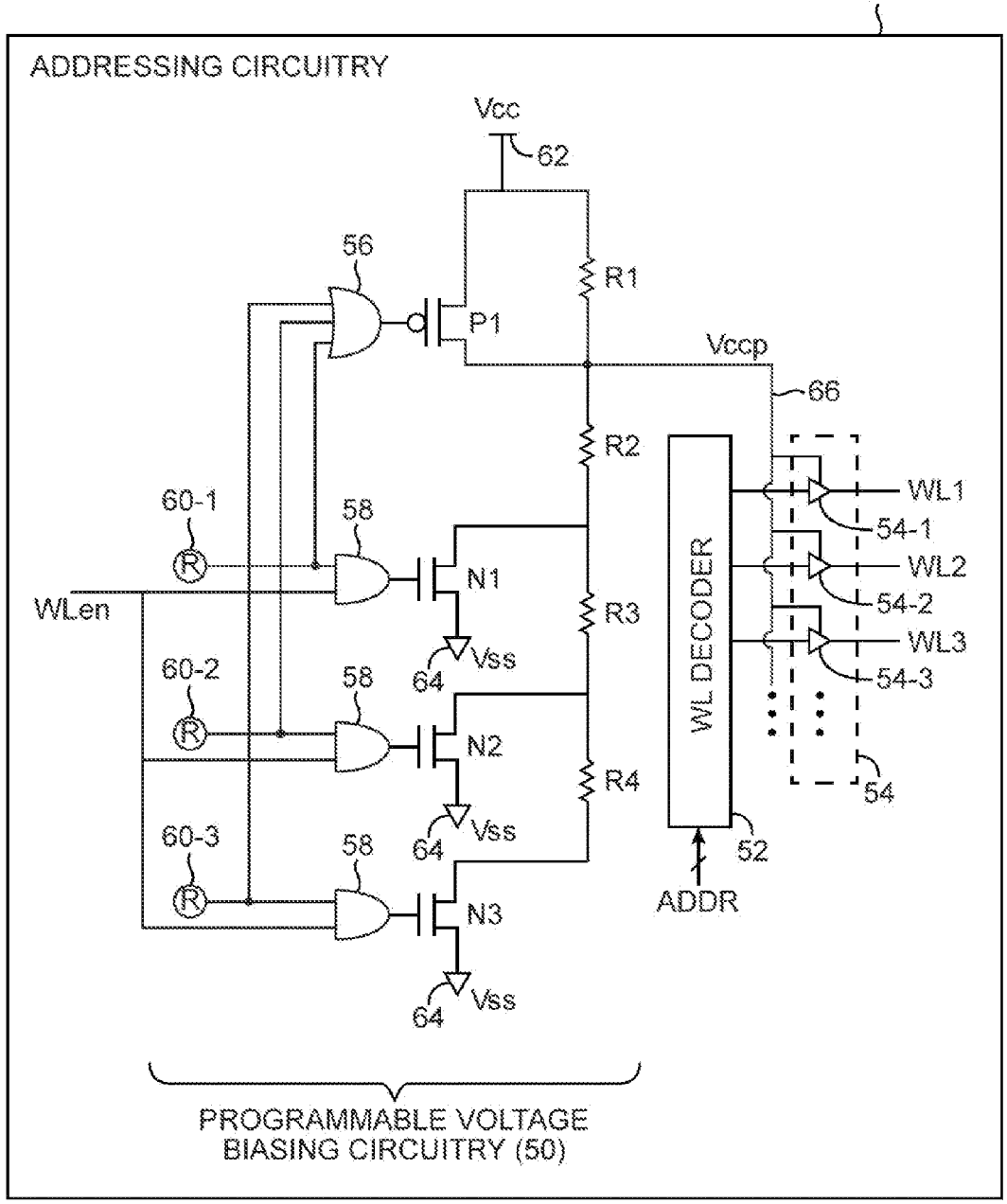
FIG. 4 is a circuit diagram of illustrative programmable word line voltage biasing circuitry in accordance with an embodiment of the present invention.

FIG. 4 is a diagram of programmable voltage biasing circuitry 50 that can be used to provide adjustable word line voltage levels. As shown in FIG. 4, programmable voltage biasing circuitry 50 may include a resistor chain (sometimes referred to as a resistive ladder or resistor stack) having resistors R1, R2, R3, and R4 coupled in series between positive power supply line 62 and ground power supply line 64 (i.e., a ground line).

A pull-up transistor such as p-channel transistor P1 (e.g., a p-type metal-oxide-semiconductor device) may have a first source-drain terminal coupled to positive power supply line 62 and a second source-drain terminal coupled to a first intermediate node at which resistors R1 and R2 are connected. A pull-down transistor such as n-channel transistor N1 (e.g., an n-type metal-oxide-semiconductor device) may have a first source-drain terminal that is coupled to a second intermediate node at which resistors R2 and R3 are connected and a second source-drain terminal that is coupled to ground power supply line 64. N-channel transistor N2 may have a first source-drain terminal that is coupled to a third intermediate node at which resistors R3 and R4 are connected and a second source-drain terminal that is coupled to ground power supply line 64. The resistive chain that includes R1-R4 may be coupled to ground line 64 through first and second source-drain terminals of n-channel transistor N3.

Transistors N1, N2, and N3 may each have a gate that is coupled to an output of an associated logic gate such as logic NAND gate 58. Each logic NAND gate 58 may have a first input that is controlled by enable signal WLen and a second input that is controlled by a static control data bit stored in a corresponding RAM cell 60 (e.g., RAM cells 60-1, 60-2, and 60-3). Signal WLen may serve as a gating signal for circuitry 50.

Transistor P1 may have a gate that is coupled to an output of an associated logic gate such as logic OR gate 56. Logic OR gate 56 may have inputs that are respectively coupled to the second inputs of logic NAND gates 58. For example, logic OR gate 56 may have a first input that is coupled to the second input of gate 58 associated with transistor N1, a second input that is coupled to the second input of gate 58 associated with transistor N2, and a third input that is coupled to the second input of gate 58 associated with transistor N3.

A programmable word line power supply voltage Vccp may be provided at the first intermediate node connected between resistors R1 and R2. Voltage Vccp may be conveyed to respective word line drivers 54 via path 66. For example, a first word line driver 54-1 that is used to supply word line signal WL1 to a first row of memory cells 20 in array 28 may have a positive power supply terminal that is coupled to path 66, a second word line driver 54-2 that is used to supply word line signal WL2 to a second row of memory cells 20 in array 28 may have a positive power supply terminal that is coupled to path 66, etc. For clarity, the ground power supply line of each word line driver 54 is not shown. Word line drivers 54 may be used to assert a selected one of word line signals WL during read/write operations and may receive signals from a decoder such as word line decoder 52. Word line decoder 52 may receive address bits ADDR and drive a corresponding one of its output high. Programmable biasing circuitry 50 and decoder 52 may form part of addressing circuitry 24.

In one suitable arrangement, RAM cells 60-1, 60-2, and 60-3 may each be configured to store a "0." Configuring RAM cells 60 using this arrangement turns on transistor P1 and turns off transistors N1, N2, and N3. In this scenario, Vccp will be pulled high to Vcc (e.g., asserted WL signals will be equal to nominal power supply voltage Vcc).

In some scenarios, it may be desirable to lower Vccp to increase read margin. For example, it may be desirable to provide a first reduced WL voltage level that is 98% of Vcc, a second reduced WL voltage level that is 95% of Vcc, and a third reduced WL voltage level that is 92% of Vcc. In this example, resistors R1, R2, R3, and R4 may have resistance values that are equal to 0.8 kilo-ohms, 9.2 kilo-ohms, 6 kilo-ohms, and 24 kilo-ohms, respectively.

For example, RAM cell 60-3 may be configured to store a "1" while the other RAM cells 60 store zeroes so that transistor N3 is turned on, and the resistive divider that includes R1-R4 will set Vccp to 98% of Vcc ([24+6+9.2]/[24+6+9.2+0.8]*Vcc). As another example, RAM cell 60-2 may be configured to store a "1" while the other RAM cells 60 store zeroes so that transistor N2 is turned on, and the resistive divider that includes R1-R3 will set Vccp to 95% of Vcc ([6+9.2]/[6+9.2+0.8]*Vcc). As another example, RAM cell 60-1 may be configured to store a "1" while the other RAM cells 60 store zeroes so that transistor N1 is turned on, and the resistive divider that includes R1 and R2 will set Vccp to 92% of Vcc (9.2/[9.2+0.8]*Vcc).

Signal WLen may serve as a gating signal for circuitry 50. If signal WLen is low, voltage Vccp may be fixed at Vcc. If signal WLen is high, voltage Vccp may be set by the current configuration of the adjustable resistor chain. Signal WLen may be asserted prior to turning on a selected row of access transistors and may be deasserted upon completion of a read/write operation. Controlling circuitry 50 in this way reduces power consumption through the resistive chain (e.g., turning off pull-down transistors N1-N3 breaks the short circuit current path through which the resistive chain is grounded).

The circuit implementation of programmable word line voltage biasing circuitry 50 described in connection with FIG. 4 is merely illustrative and is not intended to limit the scope of the present invention. If desired, the data bits that set the configuration of the resistive chain may be provided from any suitable type of programmable memory such as fuses, antifuses, electrically-programmable read-only-memory technology, random-access memory cells, mask-programmed elements, etc. If desired, the resistive chain may include less than four resistors or more than four resistors or may include any number of resistive circuits configured to provide the desired range of voltage values for Vccp (e.g., Vccp may be lowered to below 90% of Vcc, below 80% of Vcc, below 70% of Vcc, etc.). Other suitable circuit implementations for providing adjustable word line voltage levels may be used, if desired.

As described above, memory cells 20 manufactured on different dies may suffer from process variations (i.e., variations in the silicon properties of the memory cell transistors that result in certain memory cells 20 having less than desired read/write margins). Dies containing such "defective" memory cells 20 may exhibit Vccmin's that fail to meet design criteria (e.g., Vccmin's that exceed a user-selected threshold Vccmin level). Techniques such as lowering the word line power supply voltage may help salvage some of these dies that would otherwise be marked as faulty and scrapped (e.g., lowering memory element address signal magnitude Vccp may help improve die yield).

Figure 5:
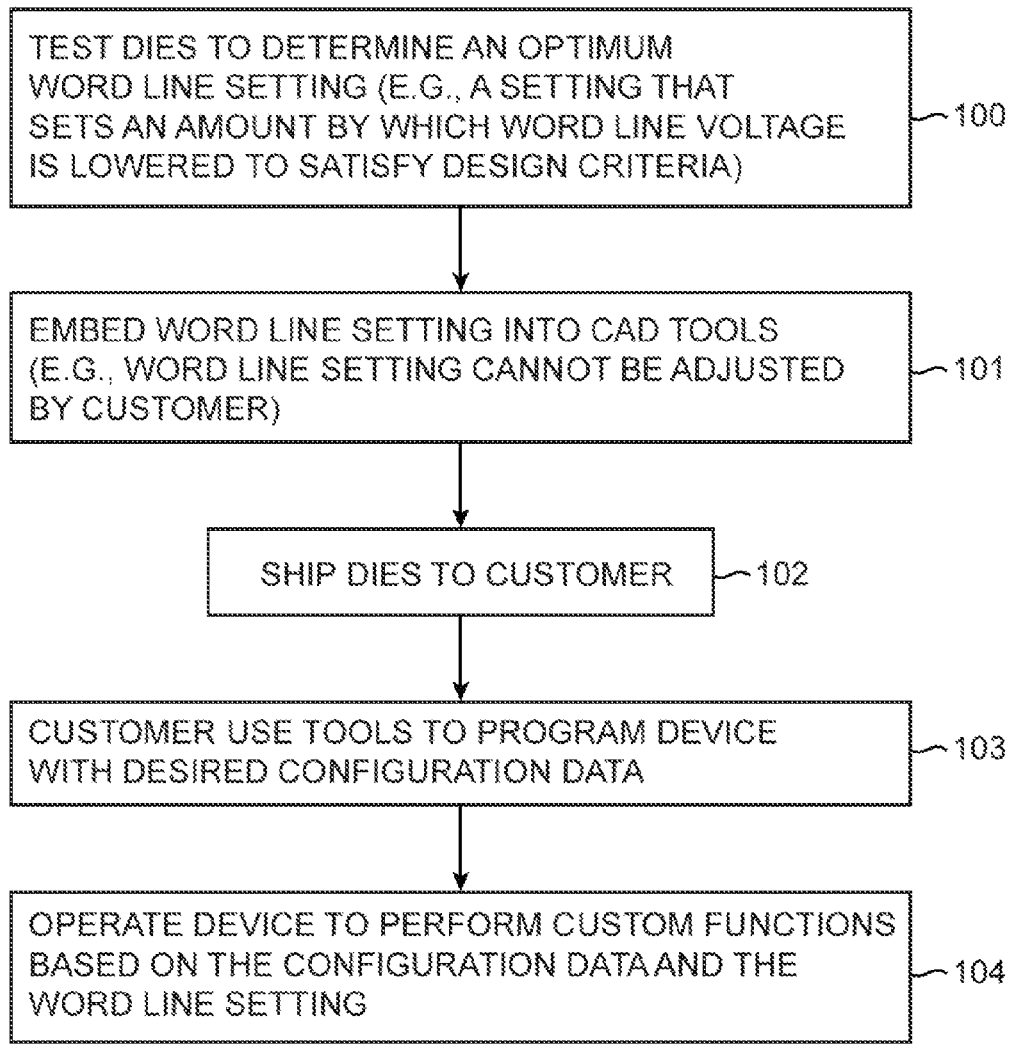
FIG. 5 is a flow chart of illustrative steps for operating an integrated circuit with programmable word line voltage biasing circuitry in accordance with an embodiment of the present invention.

FIG. 5 is a flow chart of illustrative steps for testing and using device 10. At step 100, a selected number of dies may be tested using test equipment 200 (see, e.g., FIG. 2) to determine an optimum word line setting (e.g. a setting that sets an optimum memory element address signal magnitude to meet a desired yield). For example, 50 dies may be sampled to determine the maximum Vccp that allows the 50 dies to meet 90% yield at a predetermined Vcc level.

At step 101, the word line setting may be embedded into CAD tools 560 (e.g., the word line setting may not be changed by the customer when using cad tools 560 to configure device 10). At step 102, at least a portion of the dies is shipped to a customer.

At step 103, the customer may use configuration data loading equipment to program device with desired configuration data. At step 104, device 10 may be operated based on user-customized configuration data and the word line setting (e.g., programmable word line voltage biasing circuitry 50 in device 10 may be configured to provide the reduced Vccp level determined from step 100). For example, signal WLen may be asserted during read/write operations to turn on memory drivers 54 to assert a selected word line signal WL (i.e., raising the selected word line signal WL to Vccp). Circuitry 50 need not be reconfigured during operation of device 10.

Figure 6:
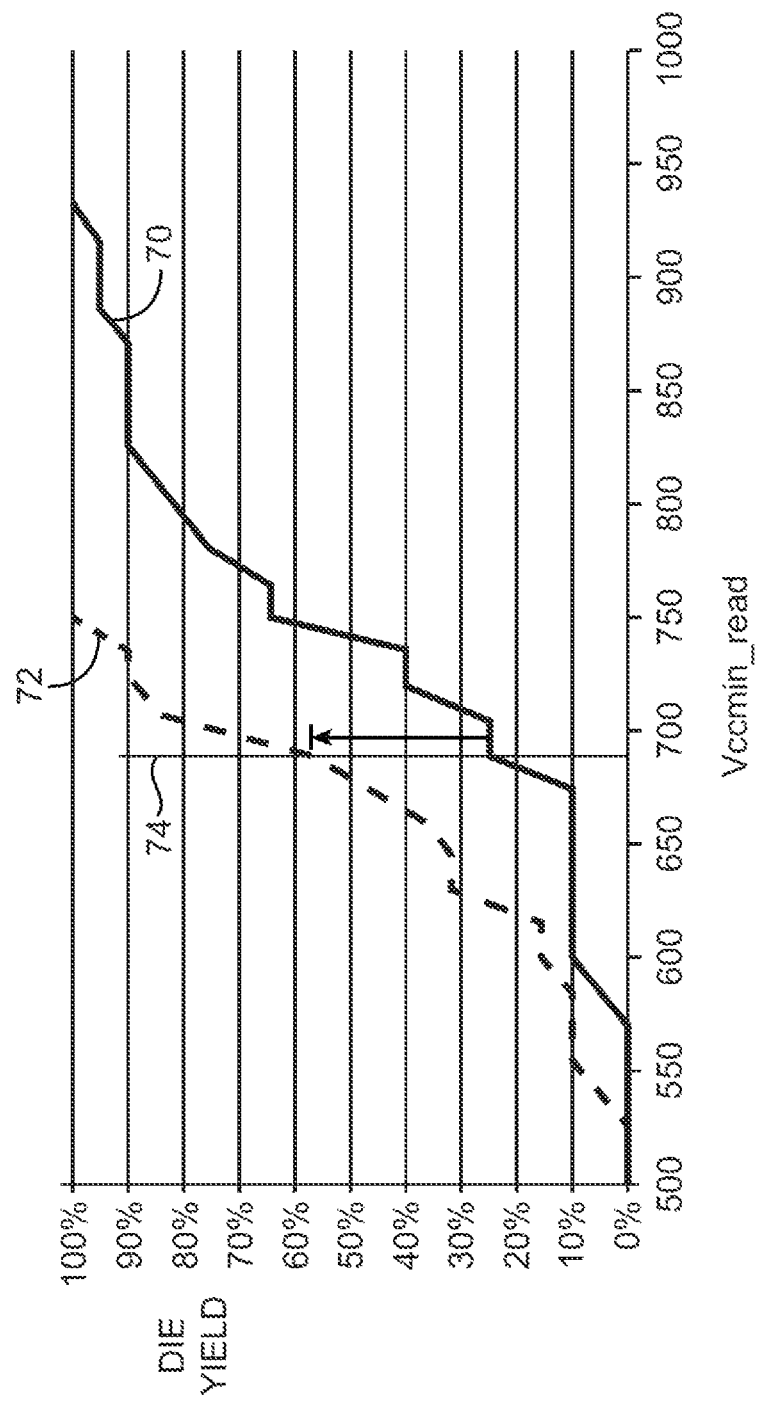
FIG. 6 is an exemplary plot of die yield versus minimum functional cell read voltage in accordance with an embodiment of the present invention.

FIG. 6 shows a plot of die yield versus Vccmin_read that may be obtained during the silicon characterization procedures of step 100 (see, e.g., FIG. 5). Twenty dies may be characterized to obtain the plot in FIG. 6 (as an example). Die yield may be defined as the number of passing dies divided by the total number of dies tested. A die is considered to be "passing" if all of its memory cells 20 are capable of properly performing read/write operations at a power supply voltage level concurrently used for testing. Lines 70 and 72 may be obtained by performing read operations on all memory cells 20 in each of the 20 dies while gradually ramping down Vcc and keeping Vccp at desired voltage levels.

Line 70 may represent the characteristic die yield profile associated with dies tested with Vccp fixed at Vcc, whereas line 72 may represent the characteristic die yield profile associated with dies tested with Vccp that is less than Vcc (e.g., with Vccp equal to 97% of Vcc). As shown in FIG. 6, the yield for dies operated using a reduced Vccp is substantially greater than the yield for dies operated using the nominal word line voltage level (Vcc) at any given Vccmin_read. Similarly, Vccmin_read for dies operating with the reduced Vccp is substantially less than Vccmin_read for dies operating with the nominal word line voltage level at any given yield.

Figure 8A:
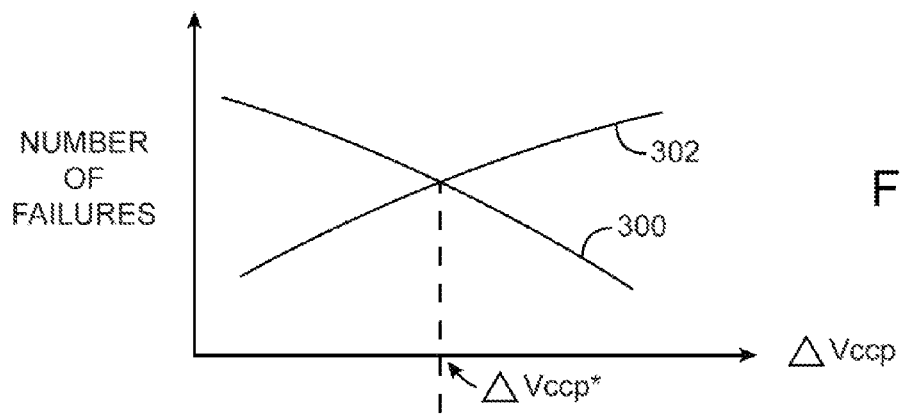
FIG. 8A is an exemplary plot of read and write failure count versus adjustments in word line voltage level in accordance with an embodiment of the present invention.

FIG. 8A is an exemplary plot of read and write failure count versus adjustments in Vccp ($\Delta$Vccp) gathered from a group of integrated circuits under test (e.g., a sample group of 20 dies, 30 dies, 40 dies, etc.). Curve 300 may represent the number of read failures, whereas curve 302 may represent the number of write failures. As shown in FIG. 8A, the number of read failures decreases as $\Delta$Vccp is increased (i.e., as the difference between Vcc and Vccp is increased), whereas the number of write failures increases as $\Delta$Vccp is increased. There may be an optimum word line voltage level at which the number of read and write failures are equal (indicated in FIG. 8A as $\Delta$Vccp*).

Figure 8B:
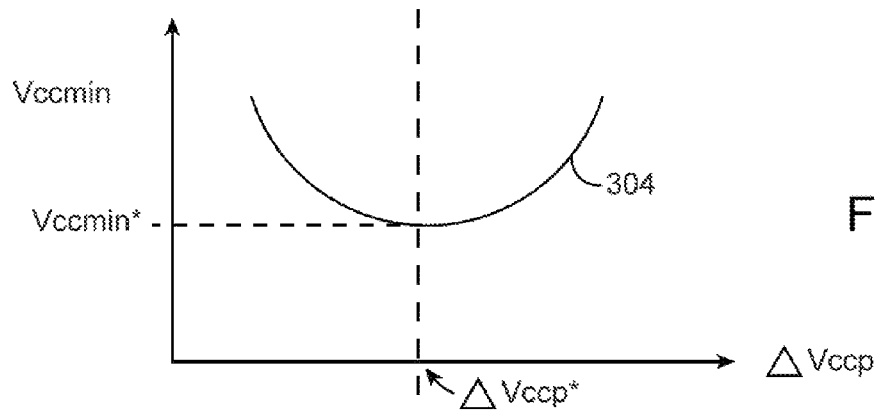
FIG. 8B is an exemplary plot of minimum operating power supply voltage versus adjustments in word line voltage level in accordance with an embodiment of the present invention.
Figure 8C:
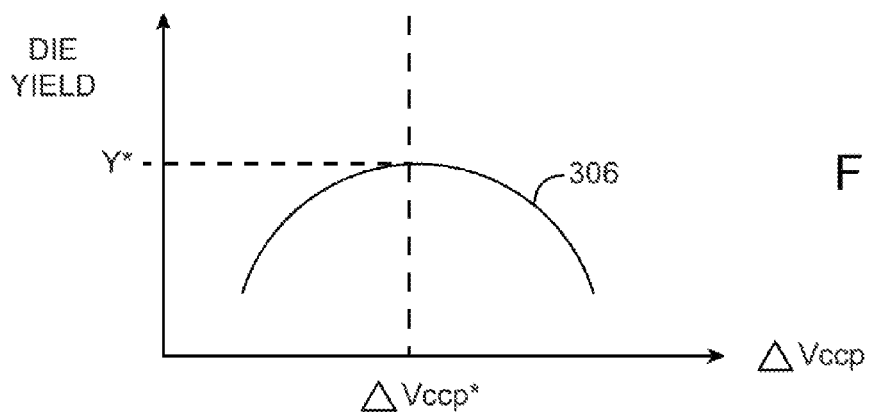
FIG. 8C is an exemplary plot of die yield versus adjustments in word line voltage level in accordance with an embodiment of the present invention.

FIG. 8B is an exemplary plot of Vccmin versus $\Delta$Vccp at a predetermined die yield. As shown in FIG. 8B, Vccmin may have a minimum value Vccmin* corresponding to $\Delta$Vccp*. FIG. 8C is an exemplary plot of die yield versus $\Delta$Vccp at a user-specified Vccmin. As shown in FIG. 8C, die yield may have a maximum value Y* corresponding to $\Delta$Vccp*. It may therefore be desirable to configure each die with an appropriate adjustment to Vccp to achieve Vccmin* and Y* (i.e., to minimize the Vccmin and to maximize die yield).

Consider a scenario in which design criteria specifies at least 50% yield at a predetermined target Vccmin_read of 690 mV. As indicated by line 74, operating memory cells 20 at nominal word line voltage (line 70) will provide an unsatisfactory yield of 25%, whereas operating memory cells 20 at a reduced word line level (line 74) will provide a satisfactory yield of greater than 50%. As shown by the example of FIG. 6, lowering Vccp may help increase yield for each Vccmin_read level. A similar graph that plots die yield versus Vccmin_write may also be obtained. In general, lowering Vccp will decrease yield for each Vccmin_write level (i.e., lowering the word line voltage supply level may increase Vccmin_read and decrease Vccmin_write for any given yield requirement).

Consider another scenario in which design criteria specifies at least 90% yield at a predetermined Vccmin of 800 mV. Forty dies may initially be tested while Vccp is set at Vcc. Initial test results may indicate a Vccmin_read of 820 mV at 90% yield and a Vccmin_write of 780 mV at 90% yield. This result is not acceptable because Vccmin_read of 820 mV exceeds the target Vccmin of 800 mV. The same 40 dies may then be tested at reduced Vccp (e.g., 96% of Vcc). New test results may indicate a Vccmin_read of 800 mV at 90% and a Vccmin_write of 800 mV at 90% yield. This result satisfies design criteria because Vccmin_read and Vccmin_write are both less than or equal to the target Vccmin of 800 mV.

Consider another scenario in which design criteria specifies at least 80% yield at a predetermined Vccmin of 700 mV. One hundred dies may initially be tested while Vccp is set at Vcc. Initial test results may indicate a Vccmin_read of 700 mV at 80% yield and a Vccmin_write of 680 mV at 80% yield. This result may be acceptable because Vccmin_read and Vccmin_write are both equal to or less than the target Vccmin of 700 mV. In this scenario, reducing Vccp may further improve read/write performance. The same 100 dies may then be tested at reduced Vccp (e.g., 94% of Vcc). New test results may indicate a Vccmin_read of 690 mV at 80% and a Vccmin_write of 690 mV at 80% yield. This result satisfies design criteria because Vccmin_read and Vccmin_write are both less than the target Vccmin of 700 mV. In general, Vccp may be adjusted to help reduce the difference between Vccmin_read and Vccmin_write at any given yield to help a batch of manufactured dies meet design criteria.

Figure 7:
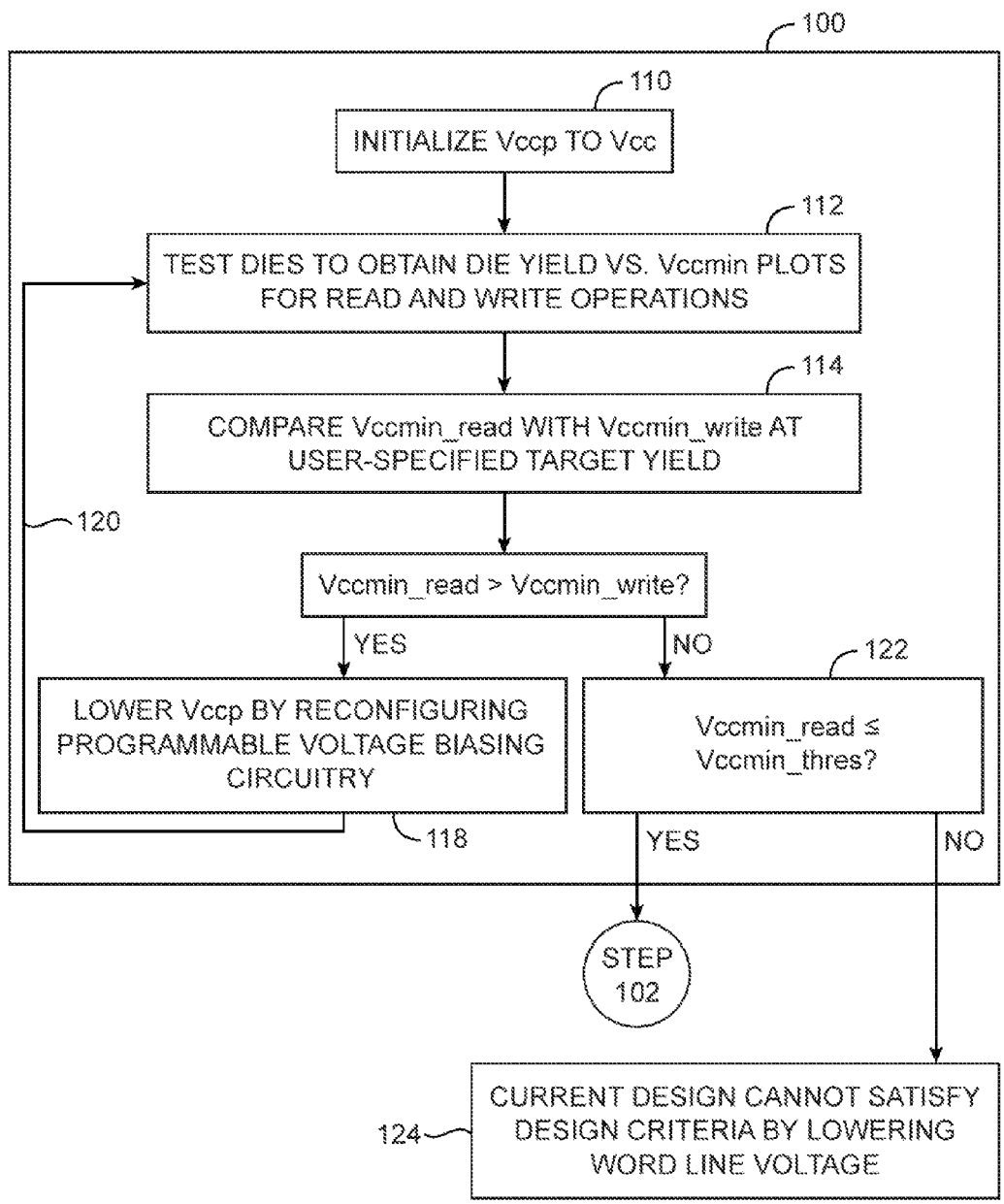
FIG. 7 is a flow chart of illustrative steps for obtaining an optimum programmable word line voltage level for addressing memory elements in accordance with an embodiment of the present invention.

FIG. 7 is a flow chart of illustrative steps that may be performed during step 100 described in connection with FIG. 5. At step 110, Vccp may be set to Vcc (e.g., by configuring RAM cells 60 to store zeroes). At step 112, a number of dies may be tested to obtain a die yield versus Vccmin plot for both read and write operations (e.g., to obtain plots of the type described in connection with FIG. 6).

At step 114, Vccmin_read and Vccmin_write may be compared at a user-specified target yield level. For example, a given Vccmin_read level corresponding to the user-specified target yield percentage (based on the yield plot associated with Vccmin_read) may be compared to a given Vccmin_write level corresponding to the user-specified target yield percentage (based on the yield plot associated with Vccmin_write). If the given Vccmin_read is greater than the given Vccmin_write, Vccp may be incrementally reduced by reconfiguring programmable word line biasing circuitry 50

(step 118, by configured a selected on of RAM cells 60 to store a "1"). Processing may loop back to step 112 to test whether the dies satisfy design criteria when Vccp has been lowered.

If the given Vccmin_read is less than or equal to the given Vccmin_write, the given Vccmin_read may be compared to the predetermined target Vccmin (Vccmin_thres). If the given Vccmin_read is less than or equal to Vccmin_thres, processing may continue to step 102 (see, e.g., FIG. 5). If Vccmin_read is greater than Vccmin_thres, test equipment may generate an alert indicating that the current memory design is not capable of satisfying design criteria by simply lowering Vccp.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit comprising:
   memory elements operable to receive a power supply voltage, wherein the memory elements comprise address transistors with gates operable to receive address signals; and
   addressing circuitry operable to assert the address signals at a single voltage level that is less than the power supply voltage, wherein the addressing circuitry comprises a plurality of drivers operable to supply the address signals to the gates and voltage biasing circuitry operable to supply an adjustable bias voltage to the drivers.

2. The integrated circuit defined in claim 1 further comprising word lines operable to convey the address signals to the gates, wherein the addressing circuitry comprises a word line decoder operable to supply the address signals to the word lines.

3. The integrated circuit defined in claim 2 wherein the plurality of drivers is interposed between the word line decoder and the word lines.

4. The integrated circuit defined in claim 1 wherein the voltage biasing circuitry comprises programmable voltage biasing circuitry.

5. The integrated circuit defined in claim 1 wherein the voltage biasing circuitry comprises a transistor coupled between a power supply terminal and a path operable to supply the adjustable bias voltage to the drivers.

6. The integrated circuit defined in claim 5 further comprising an adjustable resistor chain coupled to the power supply terminal.

7. The integrated circuit defined in claim 1 further comprising:
   a power supply terminal;
   a ground terminal;
   a resistor chain coupled between the power supply terminal and a ground terminal;
   transistors coupled to intermediate nodes within the resistor chain; and
   a plurality of logic gates operable to receive static control signals and operable to apply corresponding output signals to the transistors.

8. The integrated circuit defined in claim 7 further comprising a control path operable to apply an enable signal to the plurality of logic gates.

9. The integrated circuit defined in claim 8 wherein the voltage biasing circuitry comprises a transistor coupled between the power supply terminal and a path operable to supply the adjustable bias voltage to the drivers, the integrated circuit further comprising circuitry operable to receive the static control signals and operable to supply a corresponding control signal to the transistor.

10. The integrated circuit defined in claim 9 wherein the circuitry comprises a logic gate operable to receive the static control signals from a plurality of corresponding signal paths, wherein the logic gate has an output operable to supply the corresponding control signal and wherein the transistor has a gate coupled to the output.

11. A method for operating an integrated circuit having at least one memory element, wherein the integrated circuit is supplied with a power supply voltage, the method comprising:
   with the at least one memory element, receiving only an asserted address signal at a single voltage level that is less than the power supply voltage during write operations; and
   with addressing circuitry, supplying the asserted address signal at the single voltage level and receiving an address signal magnitude setting determined based on test data gathered from a plurality of integrated circuits.

12. The method defined in claim 11 further comprising:
   with the at least one memory element, receiving only the asserted address signal at the single voltage level that is less than the power supply voltage during read operations.

13. A method for operating an integrated circuit, comprising:
   receiving a power supply voltage with a memory element;
   providing an asserted address signal to the memory element with control circuitry, wherein the asserted address signal has a voltage level that is different than the power supply voltage during read and write operations; and
   with a driver circuit in the control circuitry that outputs the asserted address signal, receiving an adjustable power supply voltage.

14. The method defined in claim 13, wherein the voltage level of the asserted address signal is less than the power supply voltage during the read and write operations.

15. The method defined in claim 13, further comprising:
   with the control circuitry, receiving an address signal magnitude setting determined based on test data gathered from a plurality of integrated circuits, wherein the control circuitry generates address signals having a magnitude that is established by the address signal magnitude setting.

16. The method defined in claim 13,
   wherein the adjustable power supply voltage remains fixed at a predetermined voltage level during normal operation of the integrated circuit.

* * * * *